(12) United States Patent
Minamio et al.

(10) Patent No.: US 7,580,075 B2
(45) Date of Patent: Aug. 25, 2009

(54) OPTICAL DEVICE AND PRODUCTION METHOD THEREOF

(75) Inventors: Masanori Minamio, Osaka (JP); Tetsushi Nishio, Kyoto (JP); Kenji Tsuji, Osaka (JP)

(73) Assignee: Panasonic Corporation, Osaka (JP)

( * ) Notice: Subject to any disclaimer, the term of this patent is extended or adjusted under 35 U.S.C. 154(b) by 849 days.

(21) Appl. No.: 10/958,500

(22) Filed: Oct. 6, 2004

(65) Prior Publication Data

US 2005/0078207 A1     Apr. 14, 2005

(30) Foreign Application Priority Data

Oct. 10, 2003  (JP)  ............... 2003-352082
Apr. 26, 2004  (JP)  ............... 2004-130297

(51) Int. Cl.
*H04N 5/225*    (2006.01)
*H01L 21/00*    (2006.01)

(52) U.S. Cl. ........................ 348/340; 438/57
(58) Field of Classification Search ............ 257/100, 257/678, 291–292; 372/43.01; 348/340; 438/57

See application file for complete search history.

(56) References Cited

U.S. PATENT DOCUMENTS 5,748,658 A * 5/1998 Nakanishi et al. ........ 372/43.01
6,509,636 B1 * 1/2003 Tsai et al. ................... 257/678
6,528,778 B1   3/2003 Kimba et al.

(Continued)

FOREIGN PATENT DOCUMENTS

| CN | 1435927 A | 8/2003 |
|---|---|---|
| JP | 07-129987 | 5/1995 |
| JP | 2000-058805 A | 2/2000 |
| JP | 2000-066089 | 3/2000 |
| JP | 2001-77277 | 3/2001 |
| JP | 2002-043554 A | 2/2002 |
| JP | 2002-267917 | 9/2002 |
| JP | 2003-131108 | 5/2003 |

(Continued)

OTHER PUBLICATIONS

Notice of Reasons for Rejection dated May 30, 2006.

(Continued)

*Primary Examiner*—Nhan T Tran
*Assistant Examiner*—Mekonnen Dagnew
(74) *Attorney, Agent, or Firm*—McDermott Will & Emery LLP

(57) ABSTRACT

A lead frame is buried in mold resin to form a mold structure. A wide blade is used to make an indentation having an alignment step in the mold structure. Then, a narrow blade is used to split the mold structure. At the outer perimeter portion of a base which is a separate part separated from the mold structure, an alignment step is formed. Due to the alignment step, an optical element, such as a mirror tube of an imaging optical system, or the like, is readily and quickly attached.

13 Claims, 9 Drawing Sheets

U.S. PATENT DOCUMENTS

| | | |
|---|---|---|
| 6,798,031 B2 * | 9/2004 | Honda et al. ................ 257/433 |
| 6,949,808 B2 | 9/2005 | Harazono |
| 2001/0030780 A1 * | 10/2001 | Sekine et al. ................ 359/25 |
| 2003/0128291 A1 | 7/2003 | Harazono et al. |
| 2003/0147436 A1 | 8/2003 | Yagi et al. |

FOREIGN PATENT DOCUMENTS

| | | |
|---|---|---|
| JP | 2003-174574 | 6/2003 |
| JP | 2003-179217 | 6/2003 |
| JP | 2003-179218 | 6/2003 |
| WO | WO 01/91193 A2 | 11/2001 |
| WO | WO 02/054500 A1 | 7/2002 |

OTHER PUBLICATIONS

Japanese Office Action with English translation issued in corresponding Japanese Patent Application No. 2004-130297, mailed Mar. 6, 2007.

Chinese Office Action, with English Translation, issued in corresponding Chinese Patent Application No. 200410084985.7, Dated on Jun. 29, 2007.

European Search Report issued in European Patent Application No. EP 04 02 4089, mailed Sep. 18, 2007.

European Office Action issued in European Patent Application No. EP 04024089.7-1528 dated on Sep. 29, 2008.

* cited by examiner

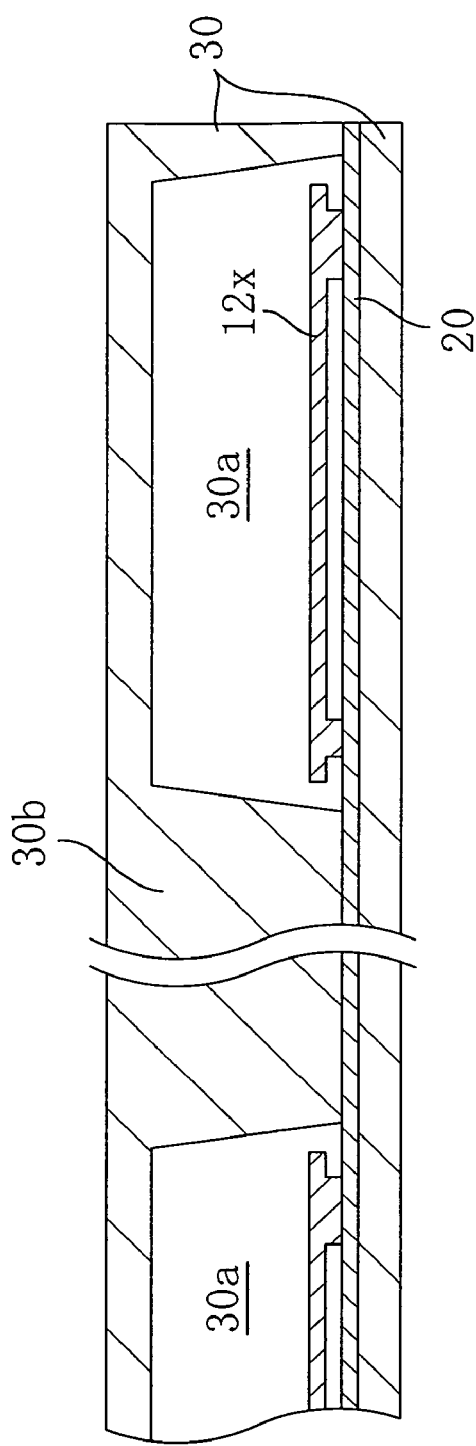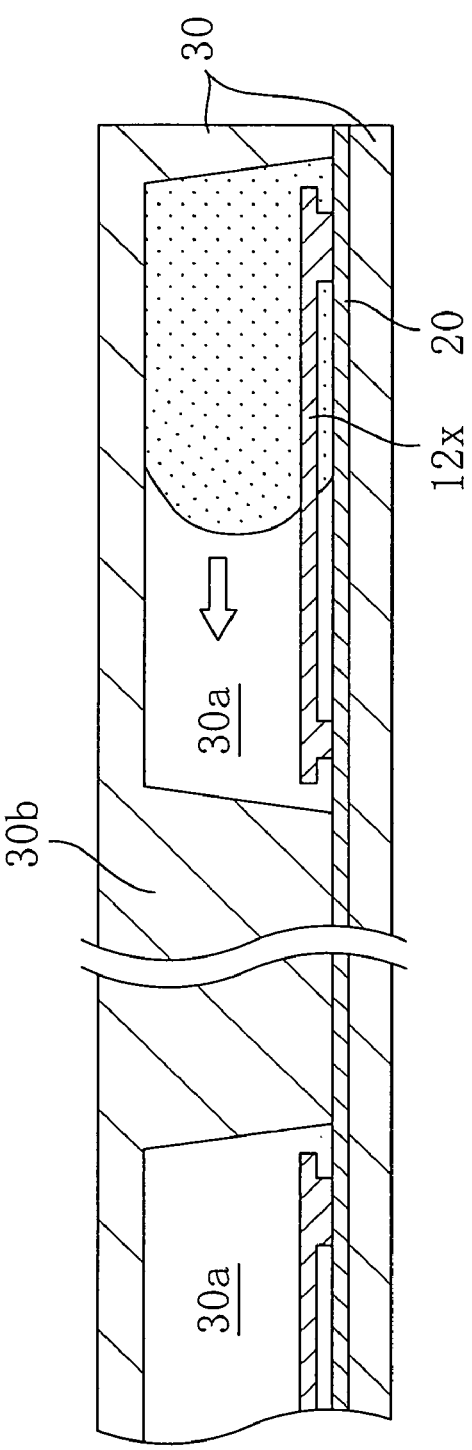
FIG. 3A
FIG. 3B

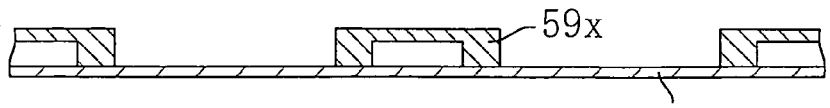
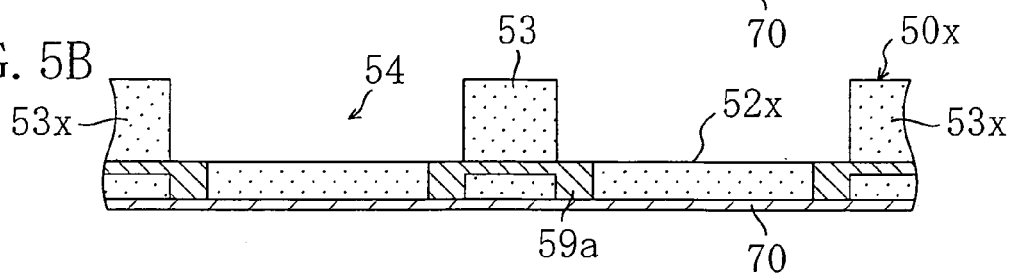
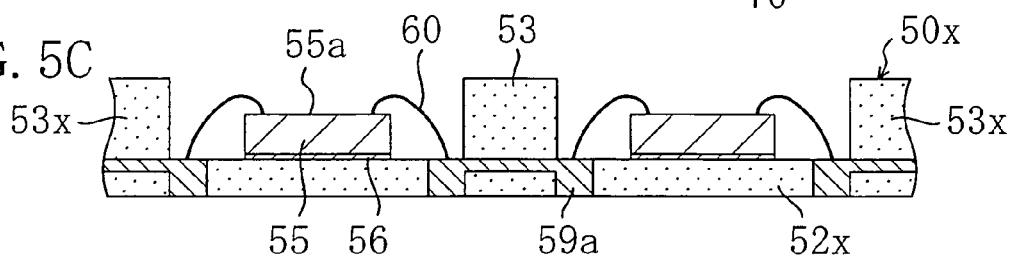
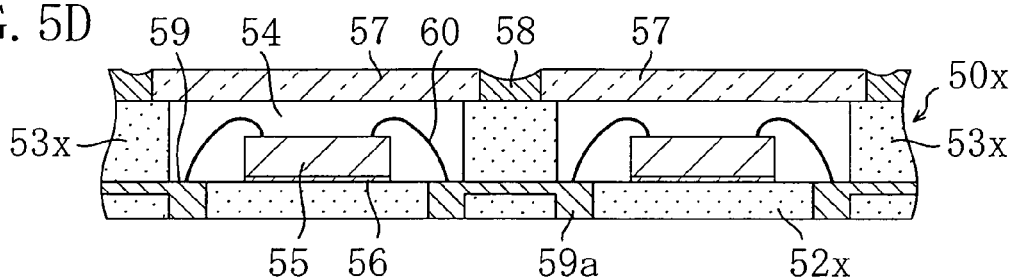
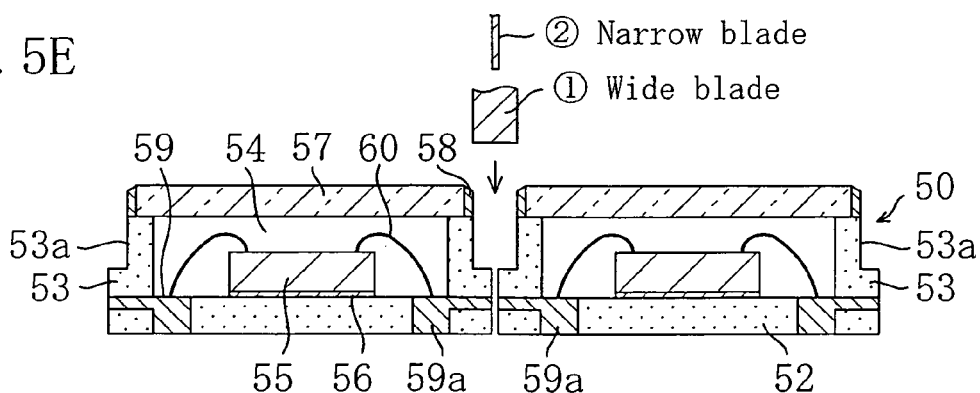
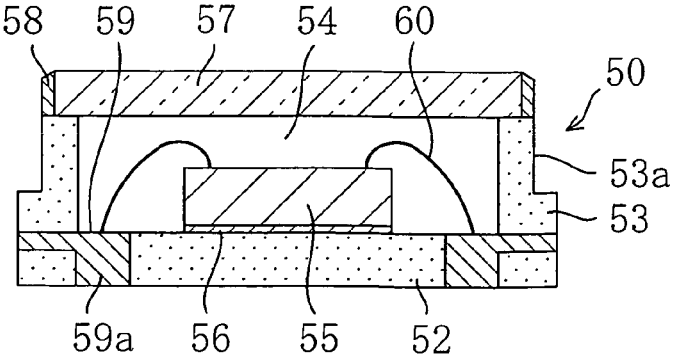

OPTICAL DEVICE AND PRODUCTION METHOD THEREOF

CROSS-REFERENCE TO RELATED APPLICATIONS

This application claims priority under 35 U.S.C. §119(a) on Japanese Patent Application No. 2003-352082 filed on Oct. 10, 2003 and Japanese Patent Application No. 2004-130297 filed on Apr. 26, 2004, the entire contents of which are hereby incorporated by reference.

BACKGROUND OF THE INVENTION

1. Field of the Invention

The present invention relates to an optical device, such as a solid state imaging device, a light receiving device for use in an optical pickup system, a hologram unit, or the like, and to a production method thereof.

2. Description of the Prior Art

In recent years, a solid state imaging device incorporated in video cameras, digital still cameras, and the like, has been provided as a package element wherein a light receiving region is covered with a translucent plate while an imaging device, such as a CCD, or the like, is mounted on an adapter, such as a base made of an insulating material, or the like.

For the purpose of decreasing the size of the solid state imaging device, the imaging device mounted on the adapter, such as a base, is in the form of a bear chip (see, for example, Japanese Unexamined Patent Publication No. 2000-58805).

FIG. 8 is a cross-sectional view of a conventional solid state imaging device. The solid state imaging device is mainly made of a ceramic material or plastic resin. Referring to FIG. 8, the solid state imaging device includes a base 131 which is in the form of a frame having an opening 132 in the central portion, an imaging element 135 attached to the lower surface of the base 131 which includes a CCD, etc., a translucent plate 136 made of glass attached onto the upper surface of the base 131 to face the imaging element 135 through the opening 132 provided therebetween.

On the lower surface of the base 131, a reentrant cavity 133 is formed in a region around the perimeter of the opening 132. A wiring 134 formed by a gold plated layer is provided to cover a region extending from a vicinity of the opening 132 at the lower surface of the base 131 to the outer perimeter side surface of the base 131 as shown in FIG. 8. An imaging element 135 is attached to the perimeter of the reentrant cavity 133 at the lower surface of the base 131 such that a light receiving region 135a is exposed to the opening 132.

Near the perimeter region of the upper surface of the imaging element 135, an electrode pad (not shown) is provided for transmitting a signal between the imaging element 135 and external devices. An internal terminal section is formed at an end of the wiring 134 adjacent to the opening 132. The internal terminal section of the wiring 134 and the electrode pad are electrically connected to each other with a bump (protruded electrode) 138 interposed therebetween. The imaging element 135, the wiring 134 and the bump 138 are sealed with a sealing resin 137 provided around the imaging element 135 at the lower surface of the base 131.

As described above, the light receiving region 135a of the imaging element 135 is provided in a closed space formed at the opening 132. This solid state imaging device is mounted on a circuit board while the translucent plate 136 is at the upper side of the device as shown in FIG. 8. An external terminal section is formed on the lower surface of the base 131 in a region of the wiring 134 which exists outside the area of the reentrant cavity 133. The external terminal section is used for connecting to an electrode on the circuit board.

Although not shown, a mirror tube incorporating an imaging optical system is provided above the translucent plate 136. As for the positional relationship between the mirror tube and the light receiving region 135a, the required accuracy is determined such that the relationship is within a predetermined tolerance.

Light which comes from an object to be imaged is focused on the light receiving region 135a of the imaging element 135 by the imaging optical system incorporated in the mirror tube. The focused light is photoelectrically converted by the imaging element 135.

An example of a solid state imaging device which has a structure different from that of the conventional base 131 shown in FIG. 8, e.g., a base having a generally flat shape wherein a reentrant cavity is not formed in the surface on which an imaging element is mounted, has been known (see, for example, Japanese Unexamined Patent Publication No. 2002-43554). In such a case, an external terminal section in an outer perimeter portion which is outside the perimeter of an opening of the base and an electrode on a circuit board are connected by a solder ball having a large diameter, or the like. The gap between the lower surface of the imaging element and the upper surface of the circuit board is adjusted by the solder ball.

The above-described structure is basically employed in a light receiving device used in an optical pickup system which performs writing, reading and rewriting of information in/from a recording medium, such as DVDs, CDs, MDs, etc., and an optical device, such as a hologram unit in which a plurality of components of an optical pickup are integrated.

SUMMARY OF THE INVENTION

However, the structure of the conventional optical device shown in FIG. 8 has the following problems.

In the case where a conventional solid state imaging device is assembled together with a mirror tube of the imaging optical system, or the like, the mirror tube is provided near the outer perimeter of the base 131 on the upper surface, and the lateral position of the mirror tube, or the like, is adjusted while the optical axis is being adjusted with visual observation. This adjustment process takes time and accordingly constitutes a factor which increases the production cost.

Since the base 131 of the conventional solid state imaging device is in the form of a frame having the opening 132, deflection or warpage is likely to occur in a cross section. If the flatness of the surface of the reentrant cavity 133 on which the imaging element 135 is mounted is insufficient, the position of the imaging element 135 is unstable. Thus, it is difficult to quickly position the mirror tube with respect to the light receiving region 135a while maintaining a predetermined accuracy.

The above-described problems may also occur in a light receiving device used in an optical pickup system and an optical device, such as a hologram unit in which a plurality of components of an optical pickup are integrated.

An objective of the present invention is to provide an optical device in which attachment of a mirror tube of an imaging optical system, a hologram, or the like, is quickly achieved and a production method of such an optical device.

In order to achieve this objective, an optical device of the present invention has an alignment step in an outer perimeter portion of a tubular portion of an adapter for an optical device to which an optical element chip and a translucent member are attached.

With this structure, the task of attaching the optical device and a mirror tube of an imaging optical system, a hologram of an optical pickup, or the like, is achieved more readily and more quickly.

The adapter may include a tubular portion, the entirety of which surrounds an opening portion. In such a case, the optical element chip is attached onto a surface of the tubular portion which is opposite to the surface to which the translucent member is attached such that a major surface of the optical element chip faces the translucent member.

The thickness of the adapter may be substantially uniform. Since the adapter has a plat-plate shape, high flatness is maintained in the surface to which the optical element chip is attached. Accordingly, the stability and accuracy in attachment of the optical element are improved.

The adapter may include a substrate portion and a tubular portion which encloses a space. In such a case, the optical element chip is attached to a portion of the substrate portion which corresponds to a wall of the space such that a major surface of the optical element chip faces the translucent member.

In such a case, it is preferable that the substrate portion of the adapter is integrally molded with the tubular portion.

According to the first optical device production method of the present invention, a mold structure having a plurality of optical device formation regions is formed, and an indentation for a step is formed using a wide blade at a border between adjacent optical device formation regions of the mold structure. Thereafter, the mold structure is split using a narrow blade at the central portion of the indentation, whereby an alignment step is formed at an outer perimeter portion of a separate part.

With the above method, the alignment step used for attaching an optical element, such as a mirror tube of an imaging optical system, or the like, is readily formed by only providing a simple step of indenting with the wide blade.

According to the second optical device production method of the present invention, a common substrate portion having a plurality of optical device formation regions and a common tubular portion are formed, and a translucent member is attached over the common tubular portion. Thereafter, sealing resin is supplied to a gap between adjacent translucent members, and then, the mold structure is split at the central portion of the sealing resin.

With the above method, the width of the common tubular portion is reduced, and accordingly, the size of the optical device is decreased.

In the second optical device production method, an indentation is formed in the sealing resin provided between the translucent members by a wide blade before the split step, whereby an alignment step used for attaching an optical element, such as a mirror tube of an imaging optical system, or the like, is readily formed by indenting with the wide blade.

As described above, according to the optical device and optical device production method of the present invention, an alignment step is formed in a tubular portion of an optical device having a wiring, an optical element chip, a translucent member, etc. With the alignment step, the task of attaching a mirror tube of an imaging optical system, a hologram, or the like, is achieved more readily and more quickly.

The optical device of the present invention can be used for a component of video cameras, digital cameras, digital still cameras, and the like, or an optical pickup used in a system for DVDs, CDs, MDs, etc.

BRIEF DESCRIPTION OF THE DRAWINGS

FIGS. 3A and 3B are cross-sectional views illustrating the molding process included in the process of producing the optical device of embodiment 1.

FIGS. 5A to 5F are cross-sectional views illustrating the process of producing the optical device of embodiment 2.

DESCRIPTION OF THE PREFERRED EMBODIMENTS

Embodiment 1

Structure of Optical Device

Figure 1A:
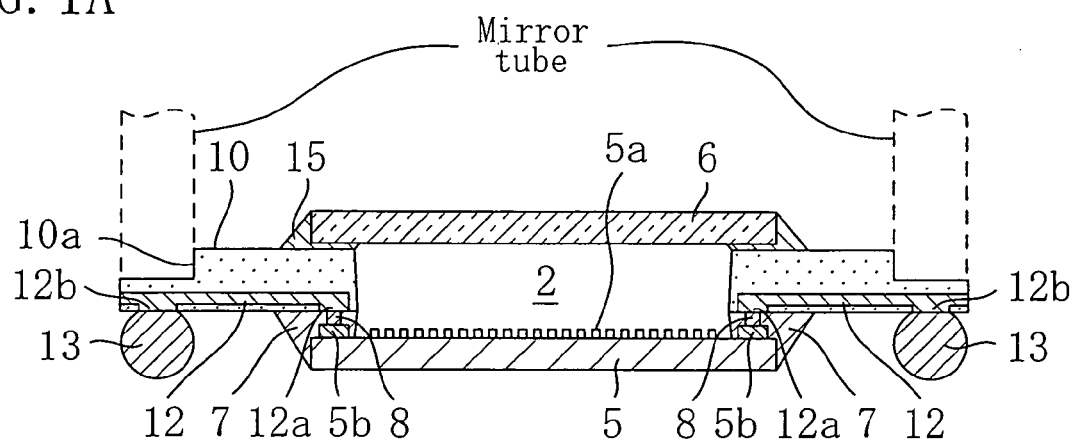
FIG. 1A is a cross-sectional view of the optical device taken along line IA-IA of FIG. 1B.
Figure 1B:
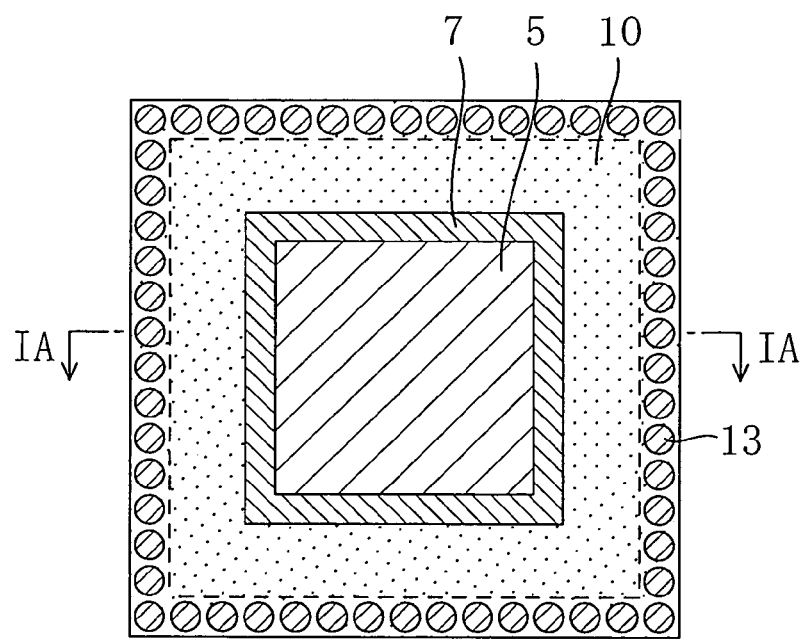
FIG. 1B shows a back surface of an optical device according to embodiment 1 of the present invention.

FIG. 1B shows a back surface of an optical device according to embodiment 1 of the present invention. FIG. 1A is a cross-sectional view of the optical device taken along line IA-IA of FIG. 1B. It should be noted that FIGS. 1A and 1B are drawn on different scales. Referring to FIGS. 1A and 1B, the optical device of embodiment 1 includes a base 10 made of a plastic resin, such as epoxy resin, or the like, which is in the form of a frame having an opening 2 in the central portion, an optical element chip 5 attached to the lower surface of the base 10, a window member 6 formed by a translucent element made of glass attached onto the upper surface of the base 10 to face the optical element chip 5 through the opening 2 provided therebetween, and a solder balls 13. The base 10 is an adapter for connecting the optical element chip and the widow element of the optical device. In embodiment 1, the entirety of the base 10 constitutes a tubular portion. This structure is called "premold structure" because it is formed by a procedure where the optical element chip is mounted on the base after the molding process.

In embodiment 1, the optical element chip 5 incorporates a solid state optical element chip, such as a CCD, or the like. The optical device is a solid state imaging device for use in video cameras, digital cameras, digital still cameras, and the like.

It should be noted that the optical element chip may incorporate a plurality of discretely-arranged light receiving elements in place of the solid state optical element chip. In such a case, the optical device is a light receiving device provided in an optical pickup used in a system for DVDs, CDs, MDs, etc.

A wiring 12 is buried in the base 10. One end of the wiring 12 extends out of molded resin that constitutes the base 10 in a region near the opening 2 at the lower surface of the base 10, thereby forming an internal terminal portion 12a. The other end of the wiring 12 extends out of the molded resin that constitutes the base 10 in a perimeter region at the lower surface of the base 10, thereby forming an external terminal portion 12b.

The optical element chip 5 is attached to the lower surface of the base 10 in a region surrounding the opening 2 such that the major surface 5a is exposed to the opening 2. Near the perimeter region of the upper surface of the optical element chip 5, an electrode pad 5b is provided for transmitting a signal between the optical element chip 5 and external devices. The internal terminal section 12a of the wiring 12 and the electrode pad 5b are electrically connected to each other with a bump (protruded electrode) 8 interposed therebetween. That is, the internal terminal section 12a of the wiring 12 is electrically connected to the electrode pad 5b of the optical element chip 5 through the bump 8. The optical element chip 5, the wiring 12 and the bump 8 are sealed with a sealing resin 7 provided around the optical element chip 5 at the lower surface of the base 10. On the other hand, on the upper surface of the base 10, the gap between the base 10 and the window member 6 is sealed with sealing resin 15 provided around the window member 6.

In embodiment 1, the base 10 has an alignment step 10a at the outer perimeter area which is formed by cutting away a portion of the base 10. As shown in FIG. 1A, the size of the alignment step 10a is determined such that the mirror tube of the imaging optical system including a lens attached to the optical device, etc., fits into the alignment step 10a, and a valley-side surface of the alignment step 10a (or the upper surface of the base 10) has a predetermined flatness.

In the optical device of embodiment 1, due to the alignment step 10a formed by cutting away a portion of the outer perimeter surface of the base 10, the step of attaching the mirror tube of the imaging optical system to the optical device to assembly a video camera, digital camera, digital still camera, or the like, is readily and quickly carried out. In the conventional optical device shown in FIG. 8, it is necessary to adjust the lateral position of the mirror tube, or the like, while adjusting the optical axis with visual observation in the process of attaching the imaging optical system to the optical device. However, in the structure of embodiment 1, the optical axis of the optical element chip of the optical device is aligned with the optical axis of the imaging optical system by simply fitting the mirror tube into the alignment step 10a of the base 10. Further, it is not necessary to provide any special member to the mirror tube for alignment. With the optical device of embodiment 1, the mirror tube of the imaging optical system is quickly attached, and a variation in the dimensional accuracy is decreased.

Figure 8:
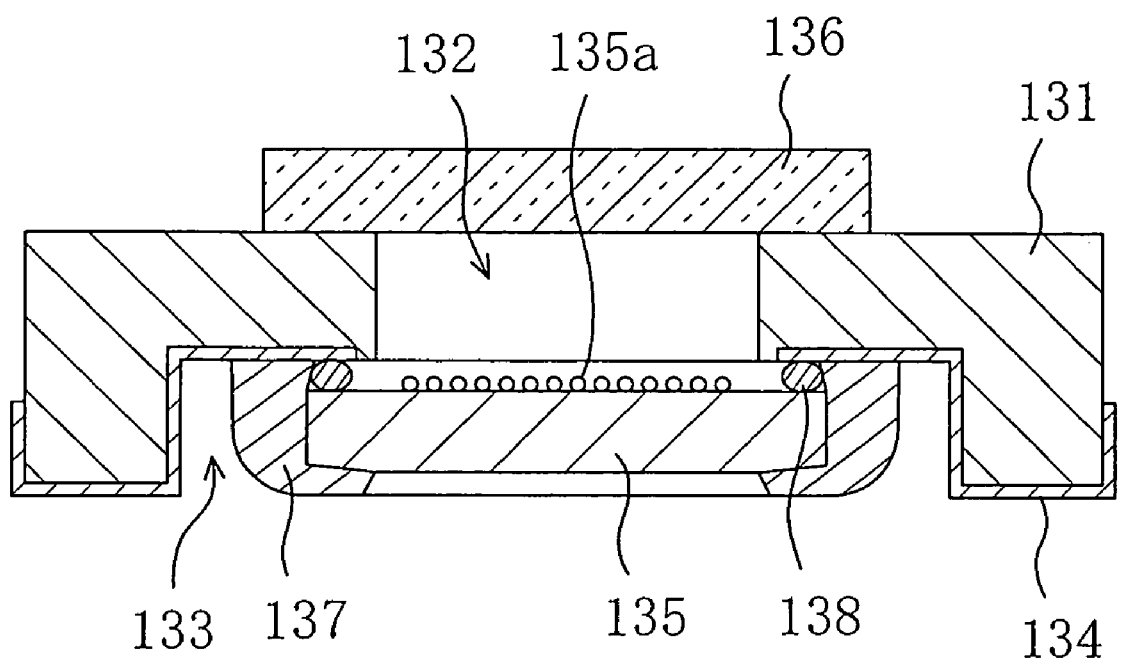
FIG. 8 is a cross-sectional view showing the structure of a conventional optical device.

Even with a structure where the base having a reentrant cavity as shown in FIG. 8 is used in place of the base 10 of embodiment 1 and an optical element chip is attached to the bottom surface of the reentrant cavity, the process of attaching the mirror tube is quickly and readily achieved. It should be noted that the base 10 of embodiment 1 has a flat lower surface such that the flatness of the base to which the optical element chip 5 is attached is satisfactorily maintained as compared with the conventional optical device shown in FIG. 8 where the optical element chip is mounted on the bottom surface of the reentrant cavity.

Production Process of Optical Device

FIGS. 2A to 2F are cross-sectional views illustrating the process of producing the optical device of embodiment 1. At the steps of FIGS. 2A to 2C, only two optical device formation regions are shown. However, in general, a lead frame having a large number of optical device formation regions arranged in a checkered pattern is used at the steps of FIGS. 2A to 2C.

FIGS. 3A and 3B are cross-sectional views illustrating the molding process included in the process of producing the optical device of embodiment 1.

Figure 2A:
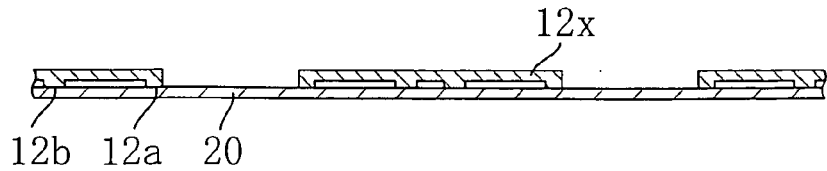
FIGS. 2A to 2F are cross-sectional views illustrating the process of producing the optical device of embodiment 1.

At the step of FIG. 2A, a lead frame 12x having a wiring pattern thereon is mounted on a sealing tape 20. The lead frame 12x has a reentrant cavity formed over large part of the lower surface by half-etching or pressing, and only a portion which is to be the internal terminal section 12a or the external terminal section 12b protrudes downward from the bottom of the reentrant cavity.

Figure 2B:
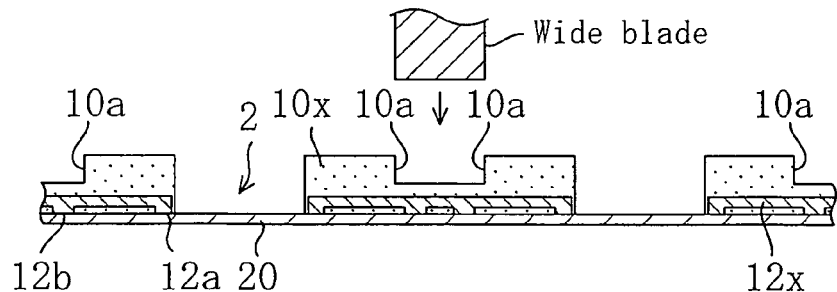

Then, molding is performed at the step of FIG. 2B. Specifically, as shown in FIGS. 3A and 3B, the lead frame 12x to which the sealing tape 20 is attached is placed in a metal mold 30, and a die cavity 30a of the metal mold 30 is filled with a plastic resin (mold resin), such as epoxy resin, or the like, whereby the lead frame 12x is buried in the mold resin except for the internal terminal section 12a and the external terminal section 12b to form a mold structure 10x. A partition section 30b for separating the die cavities 30a of the metal molds 30 is not filled with the mold resin, and an opening 2 for attaching an optical element chip is formed at the central region of each optical device formation region in the mold structure 10x.

Then, a wide blade (e.g., having a width of 0.2 to 1.0 mm) is used to make an indentation having a predetermined depth (e.g., 100 to 500 μm) in a region extending over the edges of two adjacent optical device formation regions of the mold structure 10x such that the indentation has an alignment step 10a.

Figure 2C:
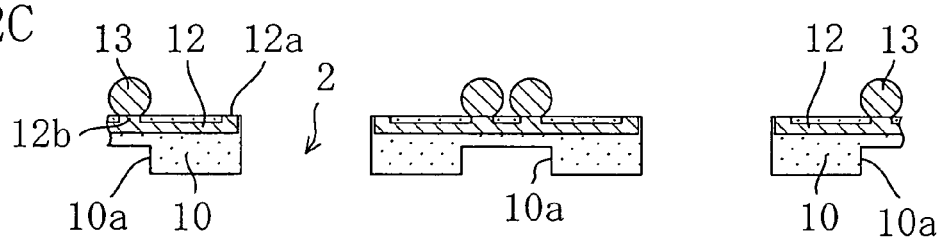

At the step of FIG. 2C, the sealing tape 20 is removed from the mold structure 10x, and the mold structure 10x is placed such that a surface on which the internal terminal section 12a and the external terminal section 12b are exposed faces upward. Solder balls 13 are formed on the external terminal section 12b.

Figure 2D:
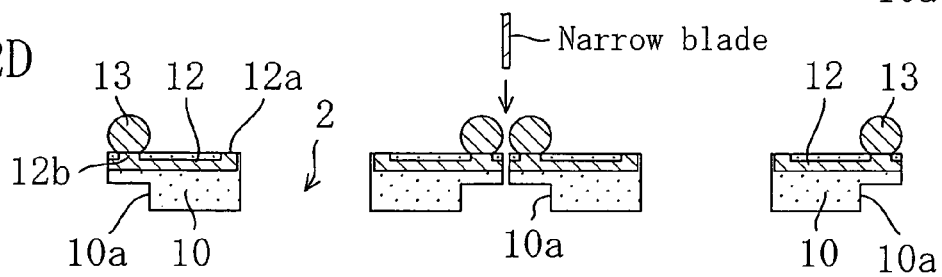

At the step of FIG. 2D, a narrow blade (e.g., having a width of 0.1 to 0.5 mm) is used to split the mold structure 10x at the border of the adjacent optical device formation regions of the mold structure 10x in the central region to form bases (separators) 10 for optical devices. As a result, an alignment step 10a is formed at the perimeter portion of the base 10. A wiring 12 having a large number of internal terminal sections 12a and external terminal sections 12b is buried in the base 10.

Figure 2E:
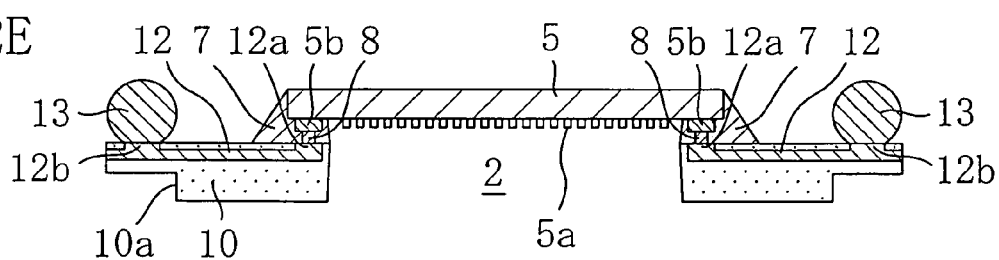

At the step of FIG. 2E, the optical element chip 5 is mounted on the base 10 such that the major surface 5a faces downward. A bump 8 is provided on the internal terminal section 12a of each base 10, and an electrode pad 5b of the optical element chip 5 is connected onto the bump 8. The gap in the connection section is filled with a sealing resin 7.

Figure 2F:
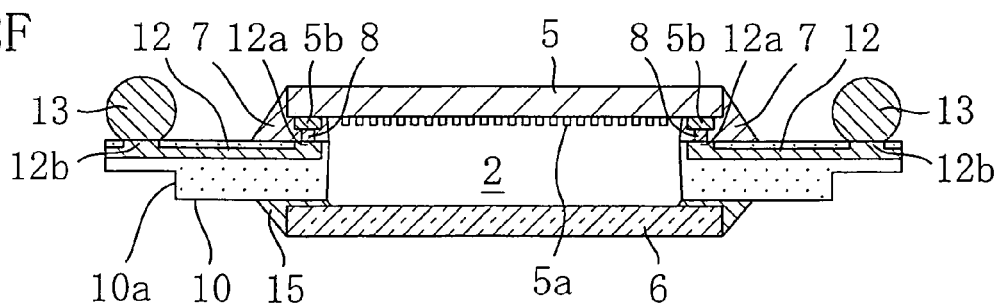

At the step of FIG. 2F, the base 10 is placed such that the surface (lower surface) of the base 10 on which the optical element chip 5 is mounted faces downward. A window member 6 made of glass is mounted on the upper surface of the base 10 to cover the opening 2. The gap between the window member 6 and the base 10 is filled with sealing resin 15 to seal the opening 2.

According to the production method of embodiment 1, at the step of FIG. 2B, a wide blade is used to make an indentation having a predetermined depth in a region extending over adjacent optical device formation regions. Then, at the step of FIG. 2D, a narrow blade, which is thinner than the wide blade used in FIG. 2B, is used to split the mold structure 10x at the border of the adjacent optical device formation regions. As a result, an alignment step 10a is formed at the perimeter portion of the base 10. In this production method, the alignment step 10a is readily formed by indenting with the wide blade. Thus, an optical device which is readily combined with the mirror tube of the imaging optical system with simple production steps is obtained, and the total cost is reduced.

The split step of FIG. 2D may be performed after the step of attaching the optical element chip at the step of FIG. 2E or after the step of attaching the window member at the step of FIG. 2F. The indentation step of FIG. 2B may be performed after the step of attaching the optical element chip at the step of FIG. 2E or after the step of attaching the window member at the step of FIG. 2F so long as it is performed before the split step.

Embodiment 2

Structure of Optical Device

Figure 4A:
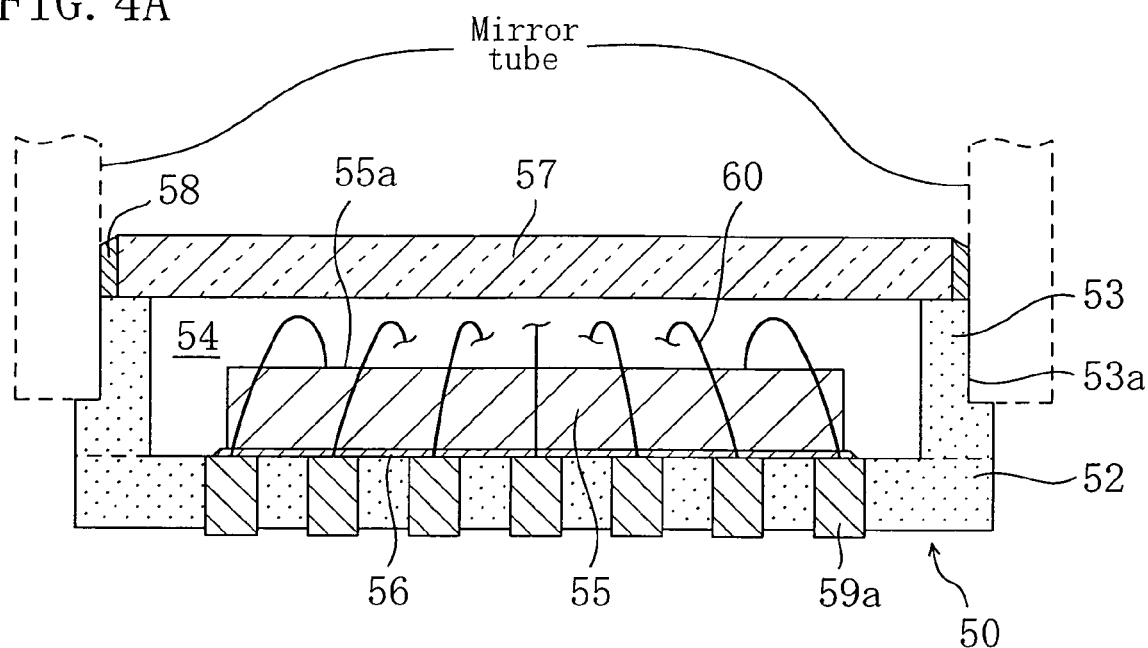
FIG. 4A is a cross-sectional view of the optical device taken along line IVA-IVA of FIG. 4B.
Figure 4B:
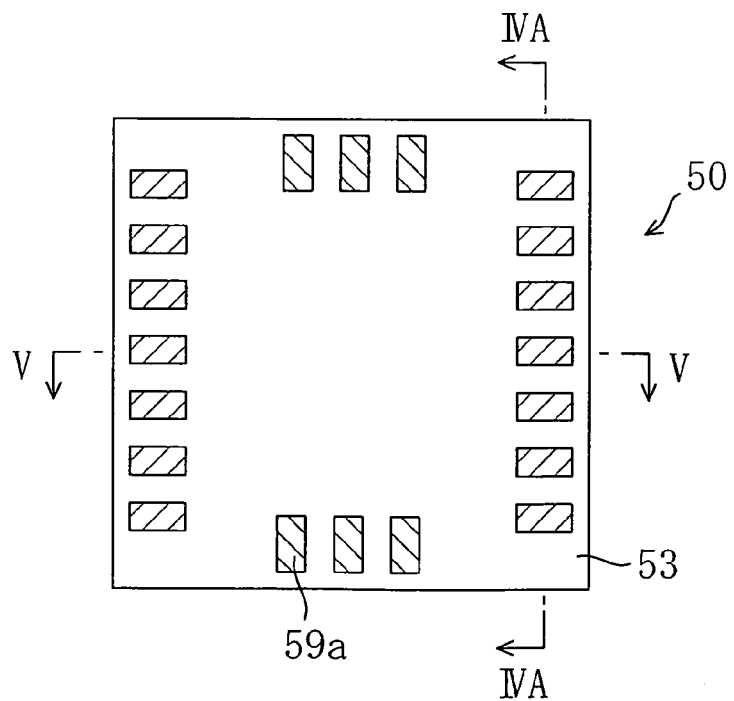
FIG. 4B shows a back surface of an optical device according to embodiment 2 of the present invention.

FIG. 4B shows a back surface of an optical device according to embodiment 2 of the present invention. FIG. 4A is a cross-sectional view of the optical device taken along line IVA-IVA of FIG. 4B. It should be noted that FIGS. 4A and 4B are drawn on different scales. Referring to FIGS. 4A and 4B, the optical device of embodiment 2 includes a case 50 formed of a thermosetting or plastic resin, such as epoxy resin, or the like, by integral molding, a window member 57, and an optical element chip 55 which is provided in a space 54 enclosed by the case 50 and the window member 57.

The case 50 includes a plate-like substrate portion 52 and a tubular portion (rib) 53 having the form of a rectangular frame. The tubular portion (rib) 53 is provided on the substrate portion 52. In embodiment 2, the substrate portion 52 and the tubular portion 53 are formed of the same material by integral molding, and therefore, the border shown by a broken line in FIG. 4A does not actually exists. However, the substrate portion 52 and the tubular portion 53 may be separate parts. In such a case, the tubular portion can be attached after the substrate portion and a wiring (lead frame) are molded. The optical element chip 55 is fixed onto the substrate portion 52 of the case 50 by an adhesive agent 56 in the space 54. That is, the case 50 has the tubular portion 53 and functions as an adapter for connecting the optical element chip and the window member.

The window member 57 is made of a translucent material, such as glass, or the like. The window member 57 is fixed to the upper edge of the tubular portion 53 of the case 50 by a sealing resin 58 at the outer perimeter. The gap between the window member 57 and the tubular portion 53 is filled with an adhesive agent, whereby the space 54 is sealed to obtain a package element. The height of the tubular portion 53 is, for example, in the range of 0.1 to 1.0 mm. The width of the tubular portion 53 is, for example, in the range of 0.1 to 1.0 mm. The thickness of the entire package element is, for example, equal to or smaller than 2 mm.

As shown in FIG. 5F which will be described later, a wiring 59 is buried in the substrate portion 52 such that an external terminal section 59a is exposed from the substrate portion 52. Only the external terminal section 59a is shown in the cross section of FIG. 4A. In embodiment 2, a sealing tape is used in the molding process. Therefore, generation of resin burr is suppressed, and the lowermost part of the external terminal section 59a protrudes downward from the lower surface of the substrate portion 52. However, it is not always necessary to perform the production process using a sealing tape. Since the reentrant cavity is formed in the lower part of the wiring 59, the part of the wiring 59 above the reentrant cavity is thin, and a region under the thin part of the wiring 59 is filled with mold resin. The pad electrodes (not shown) of the optical element chip 55 and parts of the upper surface of the wiring 59 are connected by metal wires 60.

The external surface of the tubular portion 53 of the case 50 forms a plane substantially orthogonal to the lower surface of the substrate portion 52. The internal surface of the tubular portion 53 of the case 50 is tapered from the surface of the substrate portion 52 to the window member 57 such that the die is readily removed after the resin molding process (not shown).

In embodiment 2, an alignment step 53a is formed in the external surface of the tubular portion 53 of the case 50. The size of the alignment step 53a is determined such that the mirror tube of the imaging optical system including a lens attached to the optical device, etc., fits into the alignment step 53a, and a valley-side surface of the alignment step 53a has a predetermined flatness.

In embodiment 2, due to the alignment step 53a formed in the external surface of the tubular portion 53, the step of attaching the mirror tube of the imaging optical system to the optical device to assembly a video camera, digital camera, digital still camera, or the like, is readily and quickly carried out as in embodiment 1.

In the conventional optical device, in the process of attaching the imaging optical system to the optical device, it is necessary to adjust the lateral position of the mirror tube, or the like, while adjusting the optical axis with visual observation with the mirror tube mounted on the widened upper surface of the tubular portion. However, in the structure of embodiment 2, the optical axis of the optical element chip of the optical device is aligned with the optical axis of the imaging optical system by simply fitting the mirror tube into the alignment step 53a of the tubular portion 53. Further, it is not necessary to provide any special member to the mirror tube for alignment. With the optical device of embodiment 2, the mirror tube of the imaging optical system is quickly attached, and a variation in the dimensional accuracy is decreased.

Production Process of Optical Device

FIGS. 5A to 5F are cross-sectional views illustrating the process of producing the optical device of embodiment 2. At the steps of FIGS. 5A to 5E, only two optical device formation regions are shown. However, in general, a lead frame having a large number of optical device formation regions arranged in a checkered pattern is used at the steps of FIGS. 2A to 2D.

At the step of FIG. 5A, a lead frame 59x having a wiring pattern thereon is mounted on a sealing tape 70. The lead frame 59x has a reentrant cavity formed over large part of the lower surface by half-etching or pressing, and only a portion which is to be the internal terminal section 59a protrudes downward from the bottom of the reentrant cavity.

At the step of FIG. 5B, the molding process is performed. Specifically, as described in embodiment 1 (see FIGS. 3A and 3B), the lead frame 59x to which the sealing tape 70 is attached is placed in a metal mold, and a die cavity 30a of the metal mold is filled with a mold resin, such as glass epoxy resin, or the like, whereby the lead frame 59x is buried in the mold resin except for the external terminal section 59a to form a mold structure 50x. The mold structure 50x is a common case including a substrate portion 52x which is common among a large number of optical devices and a tubular portion 53x which has a thickness determined in consideration of the width of the tubular portion 53 of two adjacent optical devices and the split width. Although not shown, each die cavity of the metal mold has a spatial shape for determining the common substrate portion 52x and the tubular portion 53x.

At the step of FIG. 5C, the sealing tape 70 is removed from the mold structure 50x, and in the space 54 of the mold structure 50x, the optical element chip 55 is placed on the substrate portion 52 such that a major surface 55a faces upward. In this step, an adhesive agent 56 is provided between the upper surface of the substrate portion 52 and the lower surface of the optical element chip 55. Thereafter, a pad electrode (not shown) of the optical element chip 55 and a part of the upper surface of each wiring 59 are connected by the metal wire 60 (wire bonding step).

At the step of FIG. 5D, a window member 57 made of glass is mounted on the upper surface of the tubular portion 53 of the mold structure 50x to cover the space 54. The gap between the window member 57 and the tubular portion 53 is filled with sealing resin 58 to seal the space 54. Herein, the sealing resin 58 is provided to fill a trench defined by the side surfaces of the window members 57 of two adjacent optical device formation regions and the upper surface of the tubular portion 53x.

At the step of FIG. 5E, a wide blade (e.g., having a width of 0.2 to 1.0 mm) is used to make an indentation having a predetermined depth (e.g., 100 to 500 μm) in a region extending over the tubular portion 53 of two adjacent optical device formation regions of the mold structure 50x such that the indentation has an alignment step 53a.

Then, a narrow blade (e.g., having a width of 0.1 to 0.5 mm) is used to split the mold structure 50x at the border of the adjacent optical device formation regions of the mold structure 50x in the central region of the tubular portion 53, whereby separate optical devices (separate elements) are obtained from the mold structure 50x. In this step, an alignment step 53a is formed at a perimeter portion of the tubular portion 53 of the optical device. Through the above-described process, an optical device shown in FIG. 5F is obtained.

According to the production method of embodiment 2, at the step of FIG. 5E, the wide blade is used to make an indentation having a predetermined depth in the central region of the tubular portion 53 which is common among the adjacent optical device formation regions, and another blade thinner than the wide blade is used to split the mold structure at the central region of the tubular portion 53 which is common among the adjacent optical device formation regions, whereby the alignment step 53a is formed at a perimeter portion of the tubular portion 53 of the resultant optical device. In this production method, the alignment step 53a is readily formed by indenting with the wide blade. Thus, an optical device which is readily combined with the mirror tube of the imaging optical system with simple production steps is obtained, and the total cost is reduced.

Since the sealing resin 58 is provided to fill the gap between the side surfaces of the window members 57 of two adjacent optical device formation regions at the step of FIG. 5D, the width of the common tubular portion 53x is narrow as compared with a conventional structure where it is necessary to provide a gap between the window members 57 of two adjacent optical device formation regions in consideration of the amount of burr of the sealing resin and the width of the mirror tube. Thus, according to embodiment 2, the size of the optical device is further reduced. Furthermore, the total cost is further reduced due to a reduction in size of the metal mold and a reduction in the amount of mold resin used.

In the example described above, tubular portions which constitute adjacent cases are integrally formed as a single unit. However, the above-described effects are obtained by the production method of embodiment 2 even when adjacent tubular portions are separately formed.

Although the molding process is performed while the lead frame is placed on the sealing tape in the production processes of embodiments 1 and 2, it is not always necessary to use the sealing tape in any of these embodiments. However, in the case where the sealing tape is used, the upper and lower surfaces of the lead frame are clamped by the upper part and the lower part of the metal mold, whereby close contact is stably obtained between the surface of the metal mold and the upper and lower surfaces of the lead frame. As a result, generation of resin burr due to molding is effectively suppressed, and the external terminal section protrudes above the sealing resin. Accordingly, installation is readily and quickly achieved. For example, solder bonding is readily achieved in the process of attaching the optical device to a mother board.

Embodiment 3

Figure 6A:
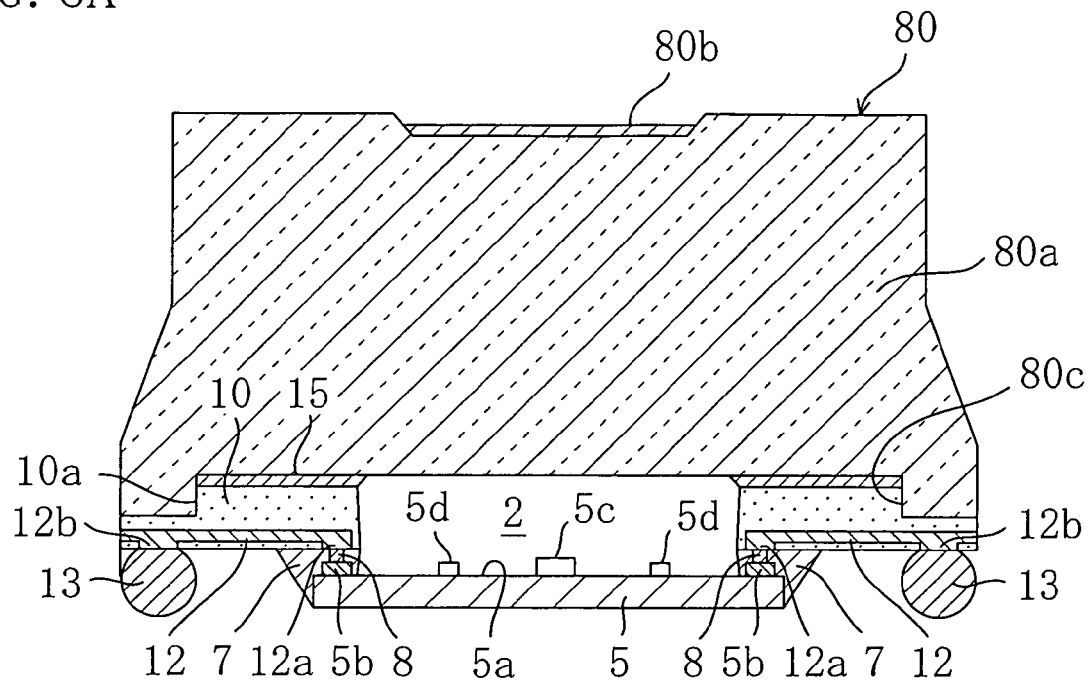
FIG. 6A is a cross-sectional view of the optical device taken along line VIA-VIA of FIG. 6B.
Figure 6B:
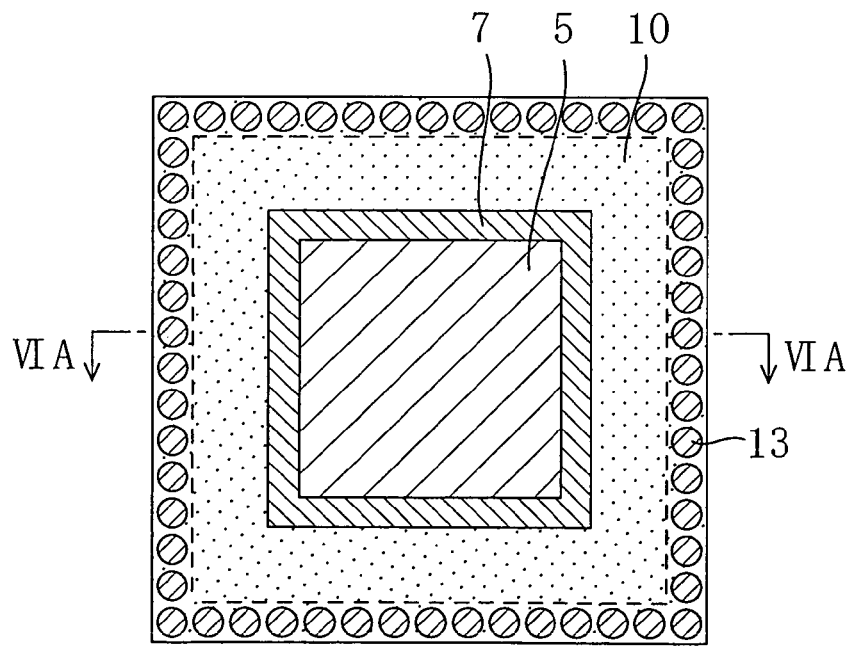
FIG. 6B shows a back surface of an optical device according to embodiment 3 of the present invention.

FIG. 6B shows a back surface of an optical device according to embodiment 3 of the present invention. FIG. 6A is a cross-sectional view of the optical device taken along line VIA-VIA of FIG. 6B. It should be noted that FIGS. 6A and 6B are drawn on different scales. Referring to FIGS. 6A and 6B, the optical device of embodiment 3 includes a base 10 made of a plastic resin, such as epoxy resin, or the like, which is in the form of a frame having an opening 2 in the central portion, an optical element chip 5 attached to the lower surface of the base 10, a hologram 80 which is a translucent element attached onto the upper surface of the base 10 to face the optical element chip 5 through the opening 2 provided therebetween, and a solder balls 13. The base 10 is an adapter for connecting the optical element chip of the optical device and the hologram of the optical device. In embodiment 1, the entirety of the base 10 constitutes a tubular portion. This structure is called "premold structure" because it is formed by a procedure where the optical element chip is mounted on the base after the molding process.

In embodiment 3, the optical element chip 5 includes a light emitting element 5c, such as a light emitting diode, or the like, and a light receiving element 5d. The optical device is a hologram unit which incorporates a plurality of components included in an optical pickup used in a system for DVDs, CDs, MDs, etc.

A wiring 12 is buried in the base 10. One end of the wiring 12 extends out of molded resin that constitutes the base 10 in a region near the opening 2 at the lower surface of the base 10, thereby forming an internal terminal portion 12a. The other end of the wiring 12 extends out of the molded resin that constitutes the base 10 in a perimeter region at the lower surface of the base 10, thereby forming an external terminal portion 12b.

The optical element chip 5 is attached to the lower surface of the base 10 in a region surrounding the opening 2 such that the major surface 5a is exposed to the opening 2. Near the perimeter region of the upper surface of the optical element chip 5, an electrode pad 5b is provided for transmitting a signal between the optical element chip 5 and external devices. The internal terminal section 12a of the wiring 12 and the electrode pad 5b are electrically connected to each other with a bump (protruded electrode) 8 interposed therebetween. That is, the internal terminal section 12a of the wiring 12 is electrically connected to the electrode pad 5b of the optical element chip 5 through the bump 8. The optical element chip 5, the wiring 12 and the bump 8 are sealed with a sealing resin 7 provided around the optical element chip 5 at the lower surface of the base 10.

The hologram 80 has a principal portion 80a made of a translucent material, such as a resin for optics, or the like, a hologram region 80b provided over the upper surface of the principal portion 80a, and a reentrant cavity 80c formed in the lower surface of the principal portion 80a. The outer perimeter portion of the base 10 has an alignment step 10a which is formed by cutting away a portion of the base 10. The internal wall surface of the reentrant cavity 80c of the hologram 80 fits into the side surface of the alignment step 10a. The lower surface of the hologram 80 and a valley-side surface of the alignment step 10a are substantially in contact with each other (it should be noted that a thin adhesive layer can be formed between these surfaces). The hologram 80 is fixed to the base 10 by an adhesive agent 15 at the interface between the bottom surface of the reentrant cavity 80c and the valley-side surface of the alignment step 10a. Alternatively, it is also possible that the bottom surface of the reentrant cavity 80c and the peak-side surface of the alignment step 10a are brought into substantial contact, and the hologram 80 is fixed to the base 10 by the adhesive agent 15 at the interface between the lower surface of the hologram 80 and the valley-side surface of the alignment step 10a. The gap between the hologram 80 and the base 10 is filled with the adhesive agent 15 to seal an internal space 2, whereby a package element is obtained. The valley-side surface of the alignment step 10a (or the peak-side surface of the alignment step 10a) has a predetermined flatness.

Although the production steps of the optical device of embodiment 3 are not shown, the optical device of embodiment 3 is produced through the process same as that shown in FIGS. 2A to 2F of embodiment 1. At the step of FIG. 2F, the hologram 80 is attached in place of the window member 6, and the hologram 80 is connected to the base 10 by the adhesive agent 15, whereby the optical device shown in FIG. 6 is readily formed.

In the optical device (hologram unit) of embodiment 3, due to the alignment step 10a formed by cutting away a portion of the outer perimeter surface of the base 10, the step of assembling the hologram unit is readily and quickly carried out. Specifically, as in the structure of embodiment 1, the optical axes of the light emitting element 5c and the light receiving element 5d of the optical element chip 5 of the optical device (hologram unit) are aligned with the optical axis of the hologram region 80b by simply fitting the hologram 80 into the alignment step 10a of the base 10.

Especially due to the alignment step 10a formed by cutting away a portion of the outer perimeter surface of the base 10, the production process of the optical device of embodiment 1 is also employed in embodiment 3. Specifically, as in the steps of FIGS. 2A to 2F, the wide blade is used to make an indentation having a predetermined depth in a region extending over the adjacent optical device formation regions, and another blade thinner than the wide blade is used to split the mold structure at the border of the optical device formation regions, whereby the alignment step 10a is formed at a perimeter portion of the base 10 of the resultant optical device. In this production method, the alignment step 10a is readily formed by indenting with the wide blade. Thus, the hologram unit is formed with simple production steps, and the total cost is reduced.

Also in embodiment 3, the split step corresponding to the step of FIG. 2D may be performed after the step of attaching the optical element chip which corresponds to the step of FIG. 2E or after the step of attaching the hologram at the step corresponding to the step of FIG. 2F. The indentation step corresponding to the step of FIG. 2B may be performed after the step of attaching the optical element chip which corresponds to the step of FIG. 2E or after the step of attaching the window member which corresponds to the step of FIG. 2F so long as it is performed before the split step.

Even with a structure where the conventional base having a reentrant cavity as shown in FIG. 8 is used in place of the base 10 of embodiment 3 and an optical element chip including a light emitting element and a light receiving element is attached to the bottom surface of the reentrant cavity, the process of attaching the hologram is quickly and readily achieved. It should be noted that the base 10 of embodiment 3 has a flat lower surface such that the flatness of the lower surface of the base to which the optical element chip 5 is attached is satisfactorily maintained as compared with the conventional optical device shown in FIG. 8 where the optical element chip is mounted on the bottom surface of the reentrant cavity.

Embodiment 4

Figure 7A:
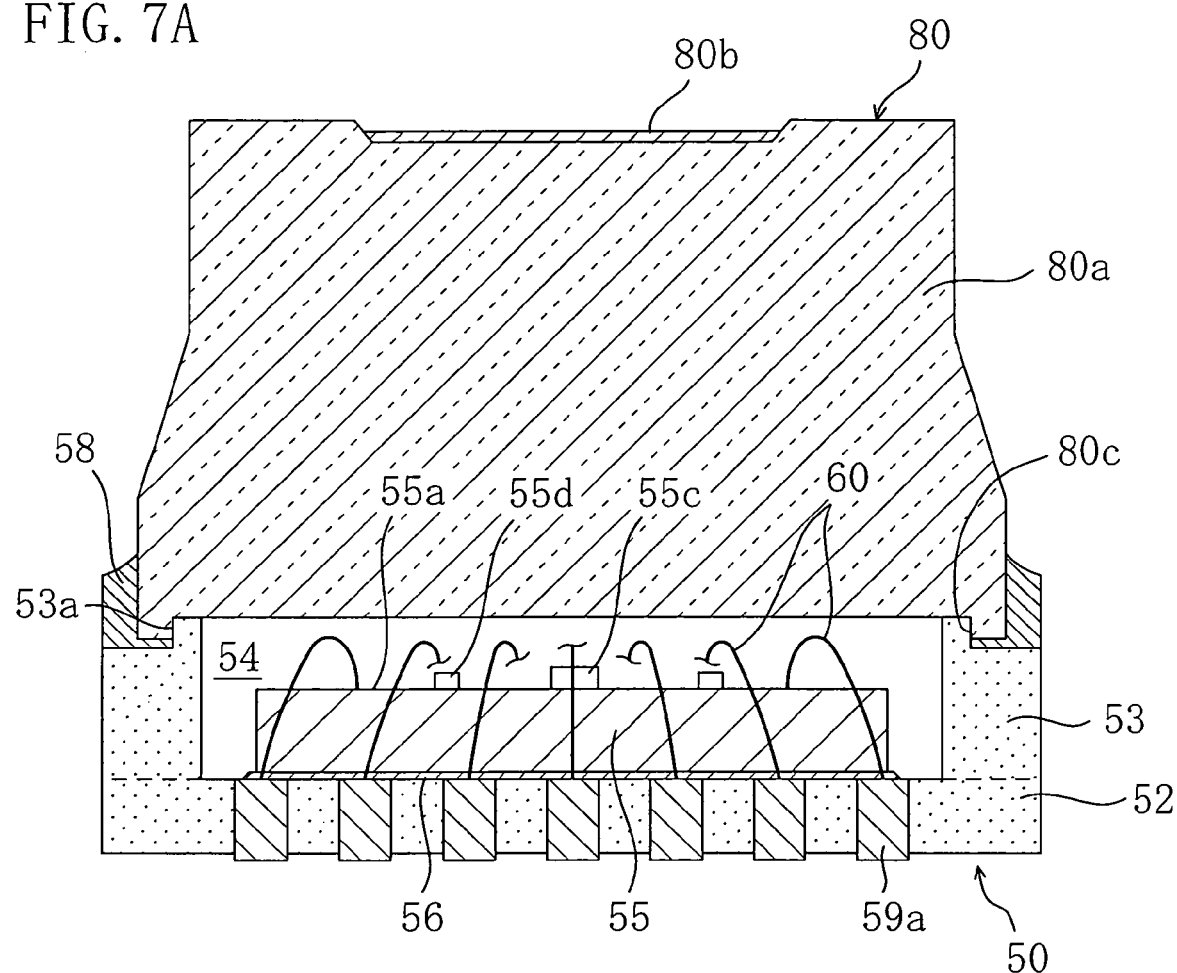
FIG. 7A is a cross-sectional view of the optical device taken along line VIIA-VIIA of FIG. 7B.
Figure 7B:
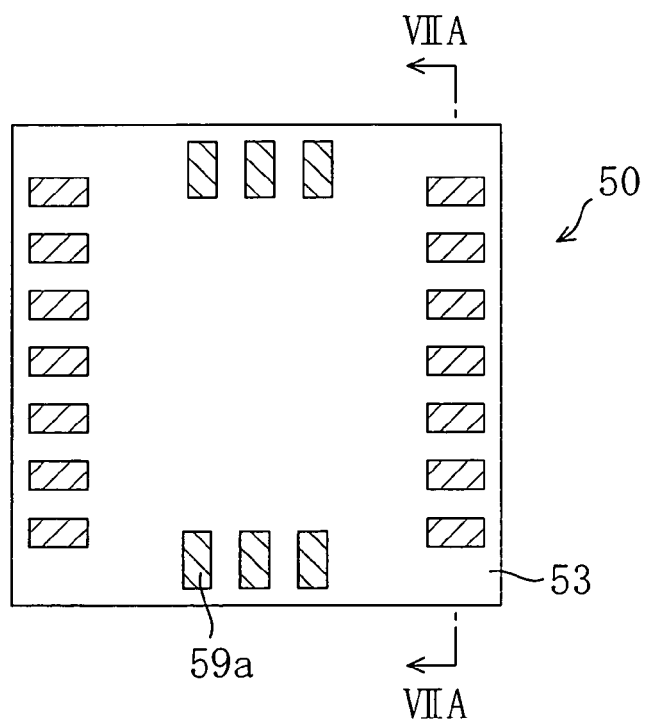
FIG. 7B shows a back surface of an optical device according to embodiment 4 of the present invention.

FIG. 7B shows a back surface of an optical device according to embodiment 4 of the present invention. FIG. 7A is a cross-sectional view of the optical device taken along line VIIA-VIIA of FIG. 7B. It should be noted that FIGS. 7A and 7B are drawn on different scales. Referring to FIGS. 7A and 7B, the optical device of embodiment 4 includes a case 50 formed of a thermosetting or plastic resin, such as epoxy resin, or the like, by integral molding, a hologram 80, and an optical element chip 55 which is provided in a space 54 enclosed by the case 50 and the hologram 80.

The case 50 includes a plate-like substrate portion 52 and a tubular portion (rib) 53 having the form of a rectangular frame. The tubular portion (rib) 53 is provided on the substrate portion 52. In embodiment 4, the substrate portion 52 and the tubular portion 53 are formed of the same material by integral molding, and therefore, the border shown by a broken line in FIG. 7A does not actually exists. However, the substrate portion 52 and the tubular portion 53 may be separate parts. In such a case, the tubular portion can be attached after the substrate portion and a wiring (lead frame) are molded. The optical element chip 55 is fixed onto the substrate portion 52 of the case 50 by an adhesive agent 56 in the space 54. That is, the case 50 has the tubular portion 53 and functions as an adapter for connecting the optical element chip and the window member.

In embodiment 4, the optical element chip 55 includes a light emitting element 55c, such as a light emitting diode, or the like, and a light receiving element 55d. The optical device is a hologram unit which incorporates a plurality of components included in an optical pickup used in a system for DVDs, CDs, MDs, etc.

The height of the tubular portion 53 is, for example, in the range of 0.1 to 1.0 mm. The width of the tubular portion 53 is, for example, in the range of 0.1 to 1.0 mm. The thickness of the entire package element is, for example, equal to or smaller than 1.5 mm.

As shown in FIG. 5F of embodiment 2, a wiring 59 is buried in the substrate portion 52 such that external terminal section 59a is exposed from the substrate portion 52. Only the external terminal section 59a is shown in the cross section of FIG. 7A. In embodiment 4, a sealing tape is used in the molding process. Therefore, generation of resin burr is suppressed, and the lowermost part of the external terminal section 59a protrudes downward from the lower surface of the substrate portion 52. However, it is not always necessary to perform the production process using a sealing tape. Since the reentrant cavity is formed in the lower part of the wiring 59, the part of the wiring 59 above the reentrant cavity is thin, and a region under the thin part of the wiring 59 is filled with mold resin. The pad electrodes (not shown) of the optical element chip 55 and parts of the upper surface of the wiring 59 are connected by metal wires 60.

The external surface of the tubular portion 53 of the case 50 forms a plane substantially orthogonal to the lower surface of the substrate portion 52. Each external surface of the case 50, i.e., the internal surface of the tubular portion 53, is tapered from the surface of the substrate portion 52 to the hologram 80 such that the die is readily removed after the resin molding process (not shown).

The hologram 80 has a principal portion 80a made of a translucent material, such as a resin for optics, or the like, a hologram region 80b provided over the upper surface of the principal portion 80a, and a reentrant cavity 80c formed in the lower surface of the principal portion 80a. The external surface of the tubular portion 53 of the case 50 has an alignment step 53a. The internal wall surface of the reentrant cavity 80c of the hologram 80 fits into the side surface of the alignment step 53a. The bottom surface of the reentrant cavity 80c of the hologram 80 and a peak-side surface of the alignment step 53a are substantially in contact with each other (it should be noted that a thin adhesive layer can be formed between these surfaces). The hologram 80 is fixed to the tubular portion 53 by the sealing resin 58 at an interface between the side surface and lower surface of the principal portion 80a and the upper surface of the tubular portion 53. Alternatively, the lower surface of the hologram 80 and the valley-side surface of the alignment step 53a may be brought into substantial contact. The gap between the hologram 80 and the tubular portion 53 is filled with the sealing resin 58 to seal the space 54, whereby a package element is obtained. The peak-side surface of the alignment step 53a (or the valley-side surface of the alignment step 53a) has a predetermined flatness.

Although the production steps of the optical device of embodiment 4 are not shown, production of the optical device of embodiment 4 is realized by partially modifying the process shown in FIGS. 5A to 5F of embodiment 2. Before the adhesive application step of FIG. 5D, the wide blade is used to make an indentation having a predetermined depth in a central region of the tubular portion 53 which is common among the adjacent optical device formation regions as shown in FIG. 5E. Thereafter, the hologram 80 is attached in place of the window member 57, and the hologram 80 and the tubular portion 53 are bonded by the sealing resin 58 as shown in FIG. 5D. Then, the narrow blade is used to split the mold structure 50x at the central region of the tubular portion 53 which is common among the adjacent optical device formation regions as shown in FIG. 5E. With such steps, the optical device shown in FIG. 7 is readily produced.

In the optical device (hologram unit) of embodiment 4, due to the alignment step 53a formed by cutting away a portion of the outer perimeter surface of the tubular portion 53, the step of assembling the hologram unit is readily and quickly carried out. Specifically, as in the structure of embodiment 2, the optical axes of the light emitting element 55c and the light receiving element 55d of the optical element chip 55 of the optical device (hologram unit) are aligned with the optical axis of the hologram region 80b by simply fitting the hologram 80 into the alignment step 53a of the tubular portion 53.

Especially due to the alignment step 53a formed by cutting away a portion of the outer perimeter surface of the tubular portion 53, the production process of the optical device of embodiment 2 is also employed in embodiment 4. Specifically, as in the steps of FIGS. 5A to 5F, the wide blade is used to make an indentation having a predetermined depth in a region extending over the adjacent optical device formation regions, the hologram is attached and bonded by an adhesive agent, and another blade thinner than the wide blade is used to split the mold structure at the border of the optical device formation regions. With such a production method, the alignment step 53a is readily formed by indenting with the wide blade. Thus, the hologram unit is formed with simple production steps, and the total cost is reduced.

Since the sealing resin 58 is provided to fill the gap between the side surfaces of the holograms 80 of two adjacent optical device formation regions at the step of FIG. 5D, the width of the common tubular portion 53x is narrow. Thus, according to embodiment 4, the size of the optical device is further reduced. Furthermore, the total cost is further reduced due to a reduction in size of the metal mold and a reduction in the amount of mold resin used.

In the example described above, tubular portions which constitute adjacent cases are integrally formed as a single unit. However, the above-described effects are obtained by the production method of embodiment 4 even when adjacent tubular portions are separately formed.

Although the molding process is performed while the lead frame is placed on the sealing tape in the production processes of embodiments 1 to 4, it is not always necessary to use the sealing tape in any of these embodiments. However, in the case where the sealing tape is used, the upper and lower surfaces of the lead frame are clamped by the upper part and the lower part of the metal mold, whereby close contact is stably obtained between the surface of the metal mold and the upper and lower surfaces of the lead frame. As a result, generation of resin burr due to molding is effectively suppressed, and the external terminal section protrudes above the sealing resin. Accordingly, installation is readily and quickly achieved. For example, solder bonding is readily achieved in the process of attaching the optical device to a mother board.

Variation of Embodiment 4

Figure 9A:
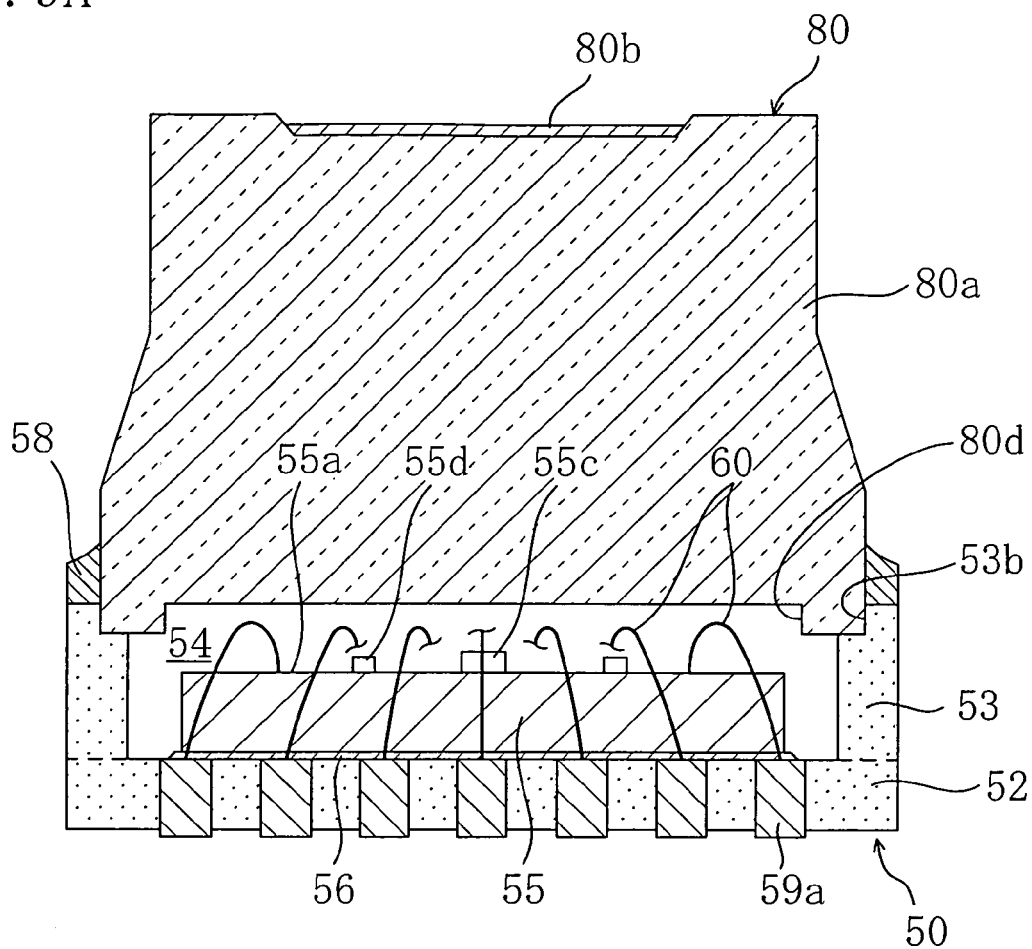
FIG. 9A is a cross-sectional view of the optical device taken along line IXA-IXA of FIG. 9B.
Figure 9B:
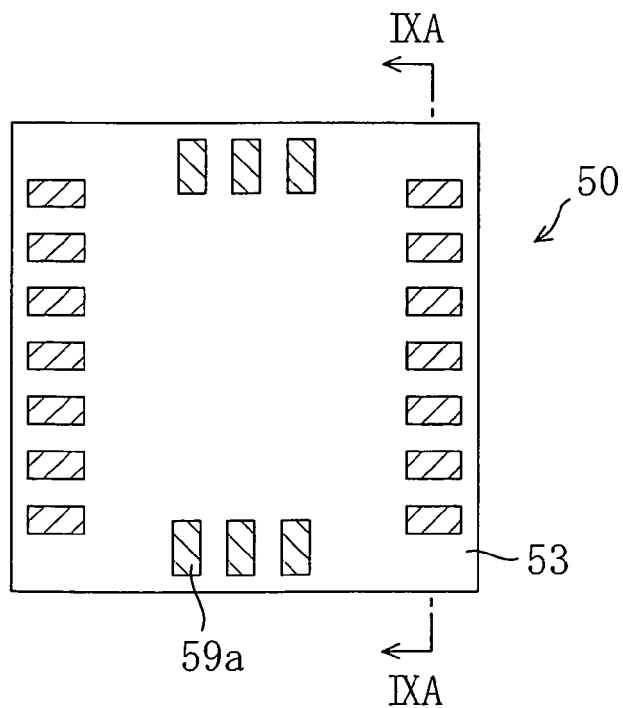
FIG. 9B shows a back surface of an optical device according to a variation of embodiment 4 of the present invention.

FIG. 9B shows a back surface of an optical device according to a variation of embodiment 4 of the present invention. FIG. 9A is a cross-sectional view of the optical device taken along line IXA-IXA of FIG. 9B. It should be noted that FIGS. 9A and 9B are drawn on different scales. In this variation, an alignment step 53b is formed inside the tubular portion 53, and a flange 80d provided along the outer perimeter of the lower surface of the hologram 80 fits into the alignment step 53b. The sealing resin 58 is provided along the peak-side surface of the alignment step 53b and the external surface of the principal portion 80a of the hologram 80. The structure of the other parts is the same as that described in embodiment 4.

In this variation, the height of the tubular portion 53 is, for example, in the range of 0.1 to 1.0 mm. The width of the tubular portion 53 is, for example, in the range of 0.1 to 1.0 mm. The thickness of the entire package element is, for example, equal to or smaller than 1.5 mm. The valley-side surface of the alignment step 53b has a predetermined flatness.

In this variation, the effects of embodiment 4 are achieved while the thickness of the tubular portion 53 is further reduced. Thus, the structure of this variation is suitable for size reduction.

In the hologram unit production process of this variation, the alignment step 53b of the tubular portion 53 is simultaneously formed in the integral molding process of the substrate portion 52 and the tubular portion 53. Thus, it is not necessary to use the wide blade as in embodiment 4. Specifically, at the step of FIG. 5D in embodiment 2, the hologram 80 is fitted into the alignment step 53b of the previously-formed tubular portion 53, and the sealing resin 58 is applied into a gap between adjacent holograms 80. Then, at the step shown in FIG. 5E, the structure is split by the narrow blade without using the wide blade.

Thus, in this variation, the width of the common tubular portion 53x (see FIG. 5B) is further narrowed as compared with embodiment 4. Thus, the size of the optical device is further decreased, the size of the metal mold is further decreased, and the amount of mold resin used is further reduced. Furthermore, the step of forming the alignment step with the wide blade is not necessary, and therefore, the production process is simplified as compared with embodiment 4.

The above-described effects of the present invention can be obtained by using the production method of this variation even when adjacent tubular portions are separately formed.

What is claimed is:

1. An optical device, comprising:
   an adapter having a tubular portion;
   a translucent member attached to a first surface of the tubular portion of the adapter, the first surface facing against the direction of incoming light;
   an optical element chip placed at a position on the adapter which faces the translucent member;
   an alignment step formed in the tubular portion of the adapter, and
   a mirror tube fitting into the alignment step, wherein
   an outer perimeter end surface of the translucent member is located on the first surface,
   a sealing member is formed on the outer perimeter end surface of the translucent member,
   an outer perimeter end surface of the sealing member and a surface of the alignment step of the adaptor parallel to the outer perimeter end surface of the translucent member lie in a same plane,
   the outer perimeter end surface of the sealing member and the surface of the alignment step of the adaptor are attached to an inner surface of the mirror tube.

2. The optical device of claim 1, wherein:
   the adapter includes a tubular portion, the entirety of which surrounds an opening portion; and
   the optical element chip is attached onto a second surface of the tubular portion which is opposite to the first surface such that a major surface of the optical element chip faces the translucent member.

3. The optical device according to claim 2, wherein:
   a wiring is buried in the adapter by molding;
   an internal terminal section, which is part of the wiring, is formed in a region in the vicinity of the opening portion near the second surface of the adapter, the internal terminal section being electrically connected to part of the optical element chip; and
   an external terminal section, which is another part of the wiring, is formed in a region in the vicinity of an outer perimeter portion of the adapter near the second surface.

4. The optical device according to claim 3, wherein the thickness of the tubular portion of the adapter is substantially uniform.

5. The optical device according to claim 1, wherein:
   the adapter includes a substrate portion and a tubular portion which encloses a space;
   the optical element chip is attached to a portion of the substrate portion which corresponds to a wall of the space such that a major surface of the optical element chip faces the translucent member.

6. The optical device according to claim 5, wherein:
   at least the substrate portion of the adapter is formed by molding while at least a part of the upper surface of a wiring is exposed; and
   the upper surface of the wiring and a part of the optical device are connected by a metal wire.

7. The optical device according to claim 6, wherein the substrate portion of the adapter is integrally molded with the tubular portion.

8. The optical device according to claim 1, wherein:
   the optical element chip includes an imaging element;
   the alignment step is provided such that a mirror tube fits into the alignment step; and
   the optical device is a solid state imaging device.

9. The optical device according to claim 1, wherein:
   the optical element chip includes a light receiving element;
   the alignment step is provided such that a mirror tube fits into the alignment step; and
   the optical device is incorporated in an optical pickup device.

10. The optical device according to claim 1, wherein:
    the translucent member is a hologram;
    the hologram fits into the alignment step of the tubular portion;
    the optical element chip includes a light receiving element and a light emitting element; and
    the optical device is a hologram unit.

11. The optical device of claim 1, wherein the sealing member is on the first surface.

12. The optical device of claim 1, wherein the alignment step of the adaptor is made of resin.

13. The optical device of claim 1, wherein the translucent member and the sealing member cover the first surface completely.

* * * * *

UNITED STATES PATENT AND TRADEMARK OFFICE
CERTIFICATE OF CORRECTION

PATENT NO. : 7,580,075 B2                                              Page 1 of 1
APPLICATION NO. : 10/958500
DATED : August 25, 2009
INVENTOR(S) : Minamio et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1222 days.

Signed and Sealed this

Fourteenth Day of September, 2010

David J. Kappos
*Director of the United States Patent and Trademark Office*